(12) United States Patent
Dewey et al.

(10) Patent No.: US 10,580,882 B2
(45) Date of Patent: Mar. 3, 2020

(54) LOW BAND GAP SEMICONDUCTOR DEVICES HAVING REDUCED GATE INDUCED DRAIN LEAKAGE (GIDL)

(71) Applicant: Intel Corporation, Santa Clara, CA (US)

(72) Inventors: Gilbert Dewey, Hillsboro, OR (US); Jack T. Kavalieros, Portland, OR (US); Willy Rachmady, Beaverton, OR (US); Matthew V. Metz, Portland, OR (US); Van H. Le, Portland, OR (US); Seiyon Kim, Portland, OR (US); Benjamin Chu-Kung, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/770,628

(22) PCT Filed: Dec. 21, 2015

(86) PCT No.: PCT/US2015/067168
§ 371 (c)(1),
(2) Date: Apr. 24, 2018

(87) PCT Pub. No.: WO2017/111914
PCT Pub. Date: Jun. 29, 2017

(65) Prior Publication Data
US 2019/0058053 A1 Feb. 21, 2019

(51) Int. Cl.
*H01L 29/66* (2006.01)
*H01L 29/775* (2006.01)
(Continued)

(52) U.S. Cl.
CPC .... *H01L 29/66583* (2013.01); *H01L 29/0607* (2013.01); *H01L 29/0696* (2013.01);
(Continued)

(58) Field of Classification Search
CPC .......................... H01L 29/7848; H01L 29/785
See application file for complete search history.

(56) References Cited

U.S. PATENT DOCUMENTS

| | | |
|---|---|---|
| 2004/0070051 A1 | 4/2004 | Sugiyama et al. |
| 2007/0001222 A1* | 1/2007 | Orlowski .............. H01L 27/108 257/347 |

(Continued)

FOREIGN PATENT DOCUMENTS

| | | |
|---|---|---|
| JP | 2014-222723 | 11/2014 |
| KR | 10-2015-0126310 | 11/2015 |

OTHER PUBLICATIONS

International Search Report and Written Opinion for International Patent Application No. PCT/US2015/067168 dated Aug. 31, 2016, 16 pgs.

(Continued)

*Primary Examiner* — Quoc D Hoang
(74) *Attorney, Agent, or Firm* — Schwabe, Williamson & Wyatt, P.C.

(57) ABSTRACT

Embodiments of the present invention are directed to low band gap channel semiconductor devices. In an example, a device includes a first semiconductor material formed above a substrate, the first semiconductor material having a first band gap. A gate dielectric layer is on a surface of the first semiconductor material. A gate electrode is on the gate dielectric layer. A pair of source/drain regions is on opposite sides of the gate electrode. A channel is disposed in the first semiconductor material between the pair of source/drain regions and beneath the gate electrode. The pair of source/drain regions includes a second semiconductor material having a second band gap, and a third semiconductor material having a third band gap. The second semiconductor material is between the first semiconductor material and the (Continued)

third semiconductor material, and the second band gap is greater than the first bandgap.

19 Claims, 9 Drawing Sheets

(51) Int. Cl.
    *H01L 29/78*     (2006.01)
    *H01L 29/267*     (2006.01)
    *H01L 29/06*     (2006.01)
    *H01L 29/08*     (2006.01)
    *H01L 29/51*     (2006.01)

(52) U.S. Cl.
    CPC ........ *H01L 29/0882* (2013.01); *H01L 29/267* (2013.01); *H01L 29/512* (2013.01); *H01L 29/66545* (2013.01); *H01L 29/66689* (2013.01); *H01L 29/66795* (2013.01); *H01L 29/775* (2013.01); *H01L 29/785* (2013.01); *H01L 29/7848* (2013.01); *H01L 29/7854* (2013.01)

(56) References Cited

U.S. PATENT DOCUMENTS

| | | | |
|---|---|---|---|
| 2010/0096680 A1* | 4/2010 | Mouli | B82Y 10/00 257/296 |
| 2013/0248999 A1 | 9/2013 | Glass et al. | |
| 2014/0045315 A1 | 2/2014 | Imec | |

OTHER PUBLICATIONS

International Preliminary Report on Patentablity for International Patent Application No. PCT/US2015/067168, dated Jul. 5, 2018, 12 pages.

* cited by examiner

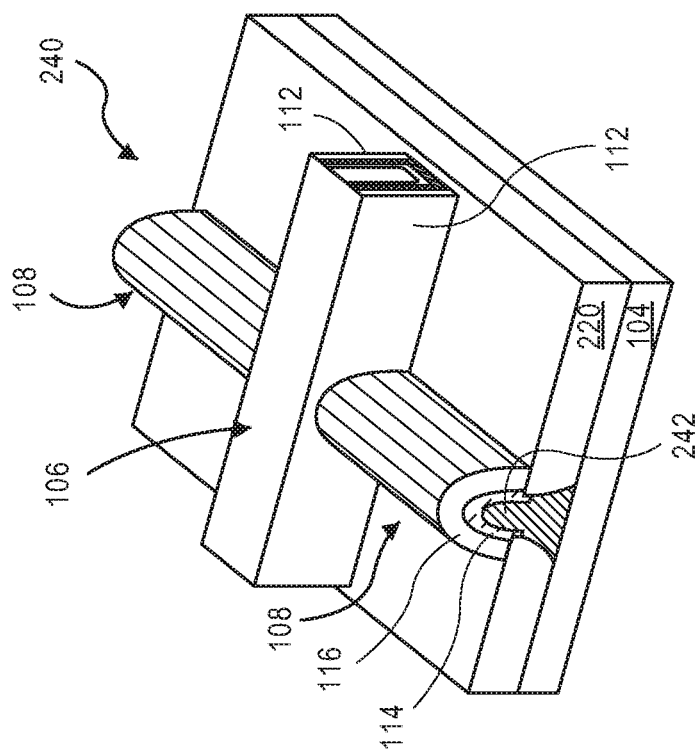
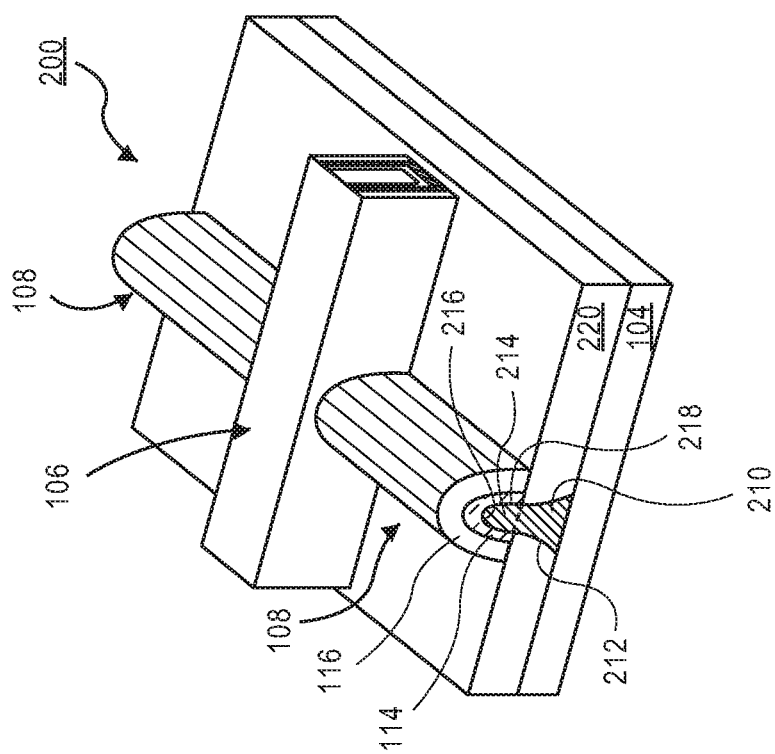

__US 10,580,882 B2__

LOW BAND GAP SEMICONDUCTOR DEVICES HAVING REDUCED GATE INDUCED DRAIN LEAKAGE (GIDL)

CROSS-REFERENCE TO RELATED APPLICATION

This patent application is a U.S. National Phase Application under 35 U.S.C. § 371 of International Application No. PCT/US2015/067168, filed Dec. 21, 2015, entitled "LOW BAND GAP SEMICONDUCTOR DEVICES HAVING REDUCED GATE INDUCED DRAIN LEAKAGE (GIDL) AND THEIR METHODS OF FABRICATION," which designates the United States of America, the entire disclosure of which is hereby incorporated by reference in its entirety and for all purposes.

BACKGROUND

1. Field

Embodiments of the present invention are related to the field of semiconductor devices and their method of fabrication.

2. Discussion of Related Art

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory devices on a chip, lending to the fabrication of products with increased capacity. The drive for ever-more capacity, however, is not without issue. The necessity to optimize the performance of each device becomes increasingly significant.

Semiconductor devices formed from germanium-based material systems offer exceptionally high hole mobility in the transistor channels due to low effective mass along with reduced impurity scattering. Such devices provide high drive current performance and appear promising for future low power, high speed logic applications. However, significant improvements are still needed in the area of germanium-based devices.

Additionally, in the manufacture of integrated circuit devices, multi-gate transistors, such as tri-gate transistors, or gate-all-around devices, such as nanowires, have become more prevalent as device dimensions continue to scale down. Many different techniques have been attempted to reduce channel or external resistance of such transistors. However, significant improvements are still needed in the area of channel or external resistance suppression. Also, many different techniques have been attempted to manufacture devices with non-Si channel materials such as SiGe, Ge, and III-V materials. However, significant process improvements are still needed to integrate these materials on Si wafers.

BRIEF DESCRIPTION OF THE DRAWINGS

FIG. 2A is an illustration of an angled view of a non-planar semiconductor device having a low band gap channel and source/drain regions with a wide band gap semiconductor to reduce gate induced drain leakage, in accordance with an embodiment of the present invention.

FIG. 2B is an illustration of an angled view of a non-planar semiconductor device having a thinned low band gap channel and source/drain regions with a wide band gap semiconductor to reduce gate induced drain leakage, in accordance with an embodiment of the present invention.

DESCRIPTION OF THE EMBODIMENTS

Embodiments of the present invention are directed to low band gap channel semiconductor devices having reduced gate induced drain leakage (GIDL) and their methods of fabrication. In the following description numerous specific details are set forth in order to provide a thorough understanding of embodiments of the present invention. In other instances, well-known semiconductor device concepts and techniques have not been described in detail in order to not unnecessarily obscure the present invention.

Embodiments of the present invention are directed to low band gap channel semiconductor devices having source/drain regions with a wide band gap semiconductor to reduce gate induced drain leakage (GIDL). Semiconductor devices in accordance with embodiments of the present invention include a channel formed from a low band gap semiconductor material, such as germanium (Ge) or high germanium content silicon germanium (SiGe). Germanium and high content germanium SiGe channels have exceptionally high mobility for holes due to low effective mass and, as such, provide high performance p type field effect transistors (FETs). However, high mobility germanium and high content germanium SiGe channels have smaller band gaps and smaller carrier effect of mass than do larger band gap channels of devices such as silicon channel devices. The smaller band gaps and carrier effect of mass allow for more tunneling at the gate-drain junction causing gate induced drain leakage (GIDL). Gate induced drain leakage (GIDL) raises the leakage floor of the device making it less energy efficient.

Accordingly, in embodiments of the present invention, a wide band gap semiconductor spacer layer, such as gallium arsenide (GaAs) or high silicon content SiGe is added to the source/drain regions to limit gate induced drain leakage (GIDL) at the drain and lower the off state leakage. In this way, high mobility PMOS channel devices, such as p type field effect transistors (FETs), can be fabricated with reduced gate induced drain leakage (GIDL) and improved Ioff. In embodiments, the wide band gap semiconductor spacer layer is highly doped to counter any external resistance (Rext) penalty associated with incorporating the wide band semiconductor spacer layer in the source/drain regions. In embodiments of the present invention, the low band gap channel semiconductor devices having source/drain regions with a wide band gap semiconductor may take the form of planar transistors, multigate transistors, such as trigate transistors and double gate transistors, or gate all around transistors, such as nanowires.

Figure 1A:
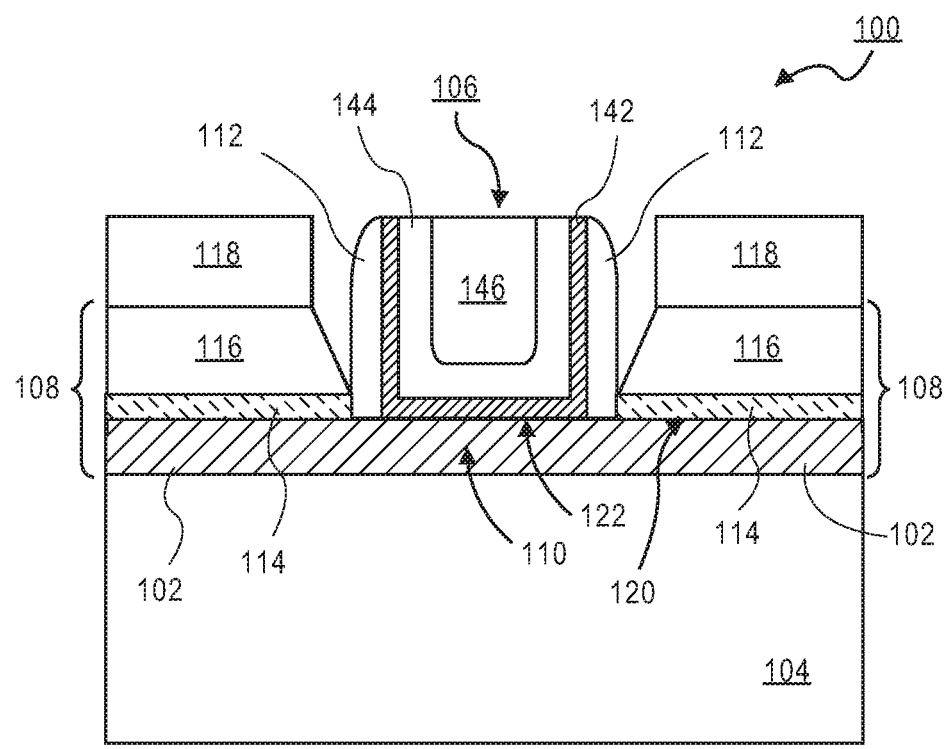
FIG. 1A is an illustration of a cross-sectional view of a semiconductor device having a low band gap channel and source/drain regions with a wide band gap semiconductor to reduce gate induced drain leakage, in accordance with an embodiment of the present invention.

A low band gap semiconductor device 100 having reduced gate induced leakage, in accordance with an embodiment of the present invention, is illustrated in FIG. 1A. Semiconductor device 100 includes a low band gap channel semiconductor layer 102 disposed above a substrate 104, such as a monocrystalline silicon substrate. A gate stack 106 is disposed on the low band gap channel semiconductor layer 102 and a pair of source/drain regions 108 are formed on opposite sides of the gate stack 106. Device 100 includes a low band gap channel 110 disposed in the low band gap channel semiconductor layer 102 beneath gate stack 106 and between the pair of source/drain regions 108. A pair of sidewall spacers 112 may be formed along laterally opposite sidewalls of gate stack 106.

In an embodiment of the present invention, the source/drain regions 108 include a wide band gap semiconductor spacer layer 114 formed on the low band gap channel semiconductor layer 102 and a contact semiconductor material layer 116 formed on the wide band gap semiconductor spacer layer 114. In embodiments of the present invention, a contact metal 118 may be disposed on the contact semiconductor material layer 116 of source/drain regions 108, as illustrated in FIG. 1A. It is to be appreciated that the source/drain regions 108 may also include portions of the channel semiconductor layer 102 on either side of the gate electrode 106. These portions of the channel semiconductor layer 102 may be heavily doped and, in some embodiments, the dopants extend slightly beneath the gate electrode. In an embodiment, the source/drain regions 108 are doped p type and are used in the formation of a p type semiconductor device.

In an embodiment of the present invention, the low band gap channel semiconductor layer 102 has a band gap of less than 800 meV and in other embodiments, less than 680 meV. In an embodiment of the present invention, the low band gap channel semiconductor layer 102 is pure germanium or essentially pure germanium. As used throughout, the terms germanium, pure germanium or essentially pure germanium may be used to describe a germanium material composed of a very substantial amount of, if not all, germanium. However, it is to be appreciated that, practically, 100% pure Ge may be difficult to form and, hence, could include a tiny percentage of Si. The Si may be included as an unavoidable impurity or component during deposition of Ge or may "contaminate" the Ge upon diffusion during post deposition processing. As such, embodiments described herein directed to a Ge channel may include Ge channels that contain a relatively small amount, e.g., "impurity" level, non-Ge atoms or species, such as Si.

In yet another embodiment of the present invention, the low band gap channel semiconductor layer 102 is silicon germanium (SiGe) having a high germanium content. In an embodiment of the present invention, the channel is silicon germanium having at least 80 atomic percent germanium and in still other embodiments at least 90 atomic present germanium. In an embodiment of the present invention, the low band gap channel semiconductor layer 102 has a thickness between 5 nm to 100 nm.

The wide band gap semiconductor spacer layer 114 has a wider band gap than the low band gap channel semiconductor layer 102. In an embodiment, semiconductor spacer layer 114 has a band gap which is at least 115 meV wider than the band gap of channel semiconductor layer 102. In an embodiment, semiconductor spacer layer 114 has a band gap which is between 150 meV to 500 meV wider than the band gap of channel semiconductor layer 102. Semiconductor spacer layer 114 may be formed to a thickness sufficient to reduce gate induced drain leakage (GIDL) but not too thick so that it generates a large series resistance in the source/drain regions 108. In an embodiment, semiconductor spacer layer 114 is formed to a thickness between 10-25% of the channel length of the device, where the channel length is defined as the length of the gate electrode along the direction of carrier transport. In an embodiment, the channel length is between 5-20 nm. In an embodiment of the present invention, the semiconductor spacer layer 114 is formed to a thickness between 1-10 nm.

The semiconductor spacer layer 114 may be doped to reduce the R external penalty associated with including a wider band gap semiconductor in the source/drain regions 108. In an embodiment of the present invention, semiconductor spacer layer 114 is highly doped p type with boron atoms to a concentration of approximately $1 \times 10^{20}$ atoms/$cm^3$. In an embodiment of the present invention, as illustrated in FIG. 1A, semiconductor spacer layer 114 may be formed on a surface 120 of channel semiconductor layer 102 which is coplanar or substantially coplanar with a surface 122 of channel semiconductor layer 102 upon which gate stack 106 is formed. Additionally, in embodiments, semiconductor spacer layer 114 is formed up to and directly adjacent to spacers 112 formed on gate stack 106, as illustrated in FIG. 1A.

In an embodiment of the present invention, spacer semiconductor layer 114 is lattice matched to channel semiconductor layer 102 to ensure fabrication of a pristine and defect-free interface. In an embodiment, spacer semiconductor layer 114 is a group III-V semiconductor, such as but not limited to gallium arsenide (GaAs). In a specific embodiment, spacer semiconductor layer 114 is GaAs and channel semiconductor layer 102 is germanium. In another embodiment of the present invention, spacer semiconductor layer 114 is silicon germanium having a high silicon content. In an embodiment of the present invention, spacer semiconductor layer 114 is silicon germanium having a silicon content of at least 50 atomic percent and in other instances of at least 70 atomic percent. In an embodiment, the silicon germanium has a uniform distribution of silicon throughout. In another embodiment of the present invention, spacer semiconductor layer 114 is a graded SiGe layer wherein the concentration of germanium is high near the channel semiconductor layer 102 and becomes lower as moving away from the channel semiconductor layer 102 until it reaches its lowest point and then begins to increase toward the contact semiconductor material layer 116. In a specific embodiment, spacer semiconductor layer 114 is a graded SiGe layer the channel semiconductor layer 102 is germanium.

In an embodiment of the present invention, contact semiconductor layer 116 is formed from a semiconductor material having a band gap which is smaller than the band gap of spacer semiconductor layer 114. In an embodiment of the present invention, contact semiconductor layer 116 is formed from the same semiconductor material as the channel semiconductor layer 102. In a specific embodiment of the present invention, contact semiconductor layer 116 and channel semiconductor layer 102 are both germanium. In still yet a more specific embodiment, channel semiconductor layer 102 is germanium, spacer semiconductor layer 114 is silicon germanium and contact semiconductor layer 116 is germanium. In an embodiment, contact semiconductor layer 116 is substantially thicker than spacer semiconductor layer 114, e.g., at least about 5 times thicker to create raised source/drain regions and to reduce R external. In an embodiment, contact semiconductor layer 116 is faceted, as depicted in FIG. 1A. In an embodiment, is highly doped p type with boron atoms to a concentration of approximately $1 \times 10^{20}$ atoms/cm$^3$.

In embodiments of the present invention, a contact metal 118 may be formed on contact semiconductor layer 116. In embodiments of the present invention, contact metal 118 may include a metal selected from the group consisting of titanium, tantalum, and tungsten.

Figure 1B:
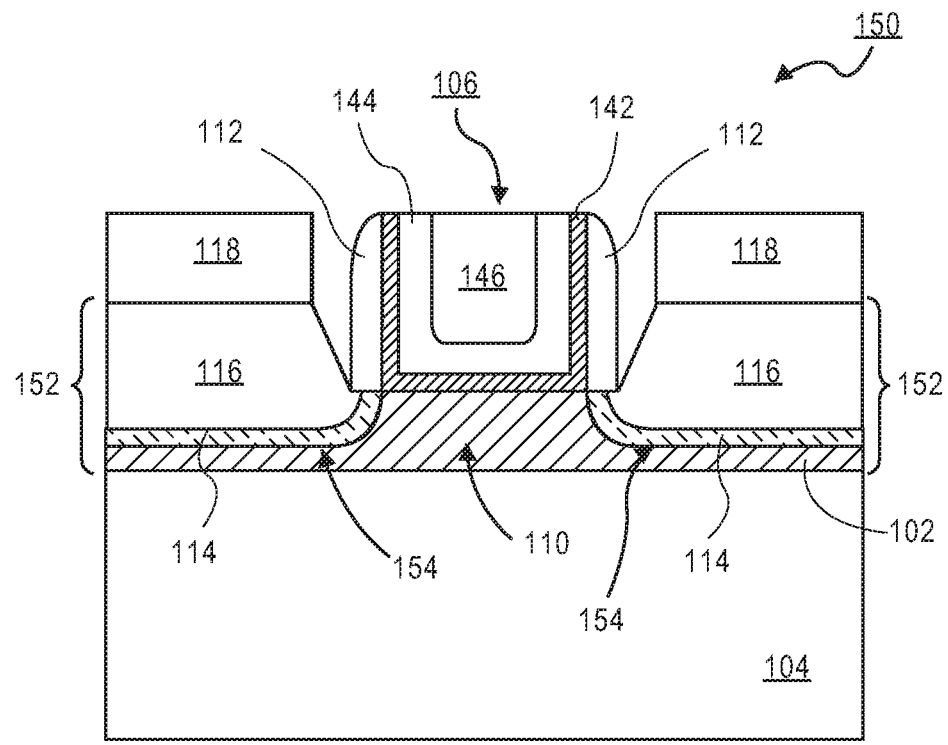
FIG. 1B is an illustration of a cross-sectional view of a semiconductor device having a low band gap channel and recessed source/drain regions with a wide band gap semiconductor to reduce gate induced drain leakage, in accordance with an embodiment of the present invention.

FIG. 1B is an illustration of a cross-sectional view of a semiconductor device 150 having a low band gap channel and recessed source/drain regions with a wide band gap semiconductor to reduce gate induced drain leakage, in accordance with an embodiment of the present invention. As illustrated in FIG. 1B, a pair of recesses 154 is formed in channel semiconductor layer 102. In an embodiment, the recesses 154 extend beneath spacers 112. Spacer semiconductor layer 114 and contact semiconductor layer 116 are then formed in the recesses 154. In this way, spacer semiconductor layer 114 may be located closer to the channel region 110 of device 150. In an embodiment, the spacer semiconductor layer 114 extends beneath the spacers 112. In one such embodiment, contact semiconductor layer 116 also extends beneath the spacers 112. It is to be noted that by recessing the channel semiconductor layer 102, spacer semiconductor layer 114 is disposed on a surface of channel semiconductor layer 102 which is beneath or lower than the surface of channel semiconductor layer 102 upon which gate stack 106 is formed. In an embodiment, the contact semiconductor layer 116 is formed to a height above the surface of channel semiconductor layer 102 upon which gate stack 106 is formed to provide raised source/drain regions.

Figure 5A:
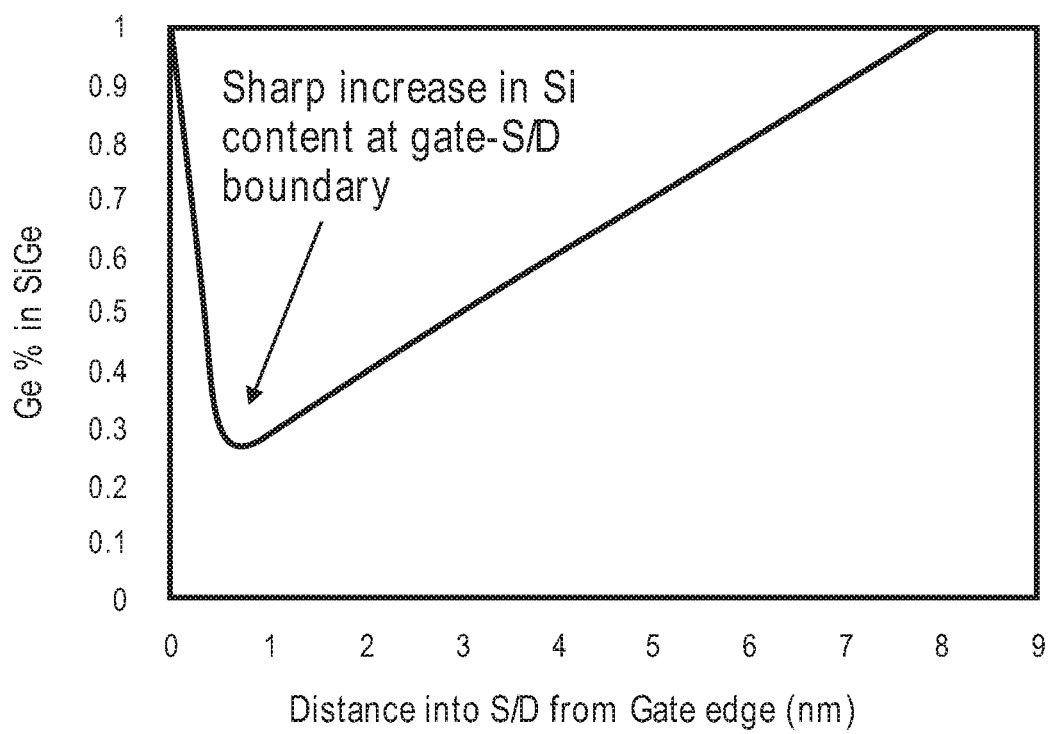
FIG. 5A is a plot of germanium concentration of a graded SiGe spacer semiconductor layer versus the distance into the source/drain region from the gate edge, in accordance with an embodiment of the present invention.
Figure 5B:
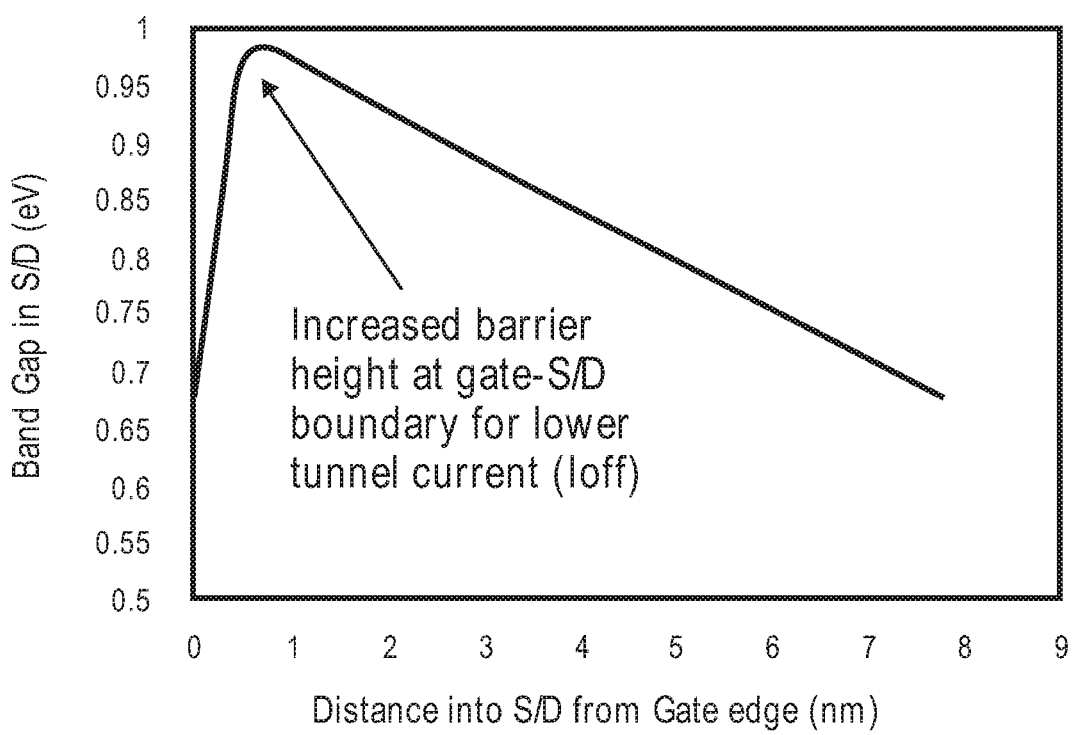
FIG. 5B is a plot of band gap of a graded SiGe spacer semiconductor layer versus the distance into the source/drain region from the gate edge, in accordance with an embodiment of the present invention.

In an embodiment, the spacer semiconductor layer 114 is a graded SiGe spacer layer having a germanium concentration and thickness illustrated in FIG. 5A. This results in a band gap distribution as depicted in FIG. 5B. For example, in one embodiment, the lowest germanium concentration, and thus the highest band gap, is located about 0.8-1.3 nm from the gate edge of the channel 110 of the device 150 illustrated in FIG. 1B. It is to be appreciated that the band gaps and distances shown in FIG. 5B is only an exemplary embodiment. Other band gaps and grading rates may be implemented within the spirit and scope of embodiments of the present invention. In an embodiment, since GIDL reduction is exponentially dependent upon the tunnel barrier height (e.g., band gap) and R external is only linearly dependent, the benefits of a reduction in GIDL can outweigh any disadvantages associated with an increase in R external. In a specific embodiment, the SiGe concentration starts at the gate edge with a high germanium concentration that grades rapidly to a low germanium content region (such as 0.3) in order to locate the highest barrier as close to the gate edge as possible. The SiGe then grades back to a higher germanium concentration further from the gate edge, but at a much more gradual rate. In one such embodiment, the grading extends back to a pure germanium region at which point the contact semiconductor layer 116 is formed.

Figure 2C:
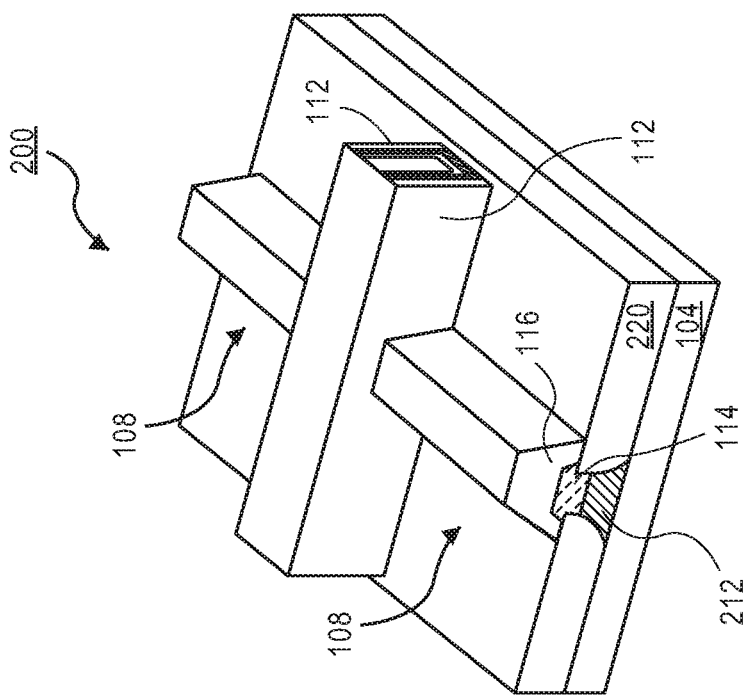
FIG. 2C is an illustration of an angled view of a non-planar semiconductor device having a low band gap channel and recessed source/drain regions with a wide band gap semiconductor to reduce gate induced drain leakage, in accordance with an embodiment of the present invention.

FIGS. 2A-2C illustrate angled views of non-planar semiconductor devices having a low band gap channel and source/drain regions with a wide band gap semiconductor to reduce gate induced drain leakage, in accordance with an embodiment of the present invention.

FIG. 2A illustrates a nonplanar device 200 having a fin 210 extending from a substrate, such as substrate 104. Fin 210 may include a subfin portion 212 located within an isolation layer 220, such as a shallow trench isolation (STI) layer and an active fin portion 214 disposed above the isolation layer 220 as shown in FIG. 2A. Active fin portion 214 has a top 216 and a pair of laterally opposite sidewalls 218. Gate stack 106 is disposed on the top 216 and sidewalls 218 of active fin 214. Source/drain regions 108 are disposed on opposite sides of gate stack 106 as described above. Channel region 110 is located in the active fin 214 between the pair or source/drain regions 108 and beneath the gate stack 106. Gate stack 106 surrounds channel region 110 on the top and two sides. In an embodiment, at least a top portion of active fin portion 214 of fin 210 comprises low band gap channel semiconductor layer 102 as described above. Source/drain regions 108 include wide band gap spacer semiconductor layer 114 formed on active fin portion 214 and a contact semiconductor layer 116 is disposed on spacer semiconductor layer 114 as described above. It is to be appreciated that a cross-sectional view of device 200 taken through the center of fin 210 from one source/drain region through the channel to the second source/drain region would yield a cross-sectional view similar to what is illustrated in FIG. 1A. The spacer semiconductor layer 114 is formed on a surface of channel semiconductor 102 of active fin 214 which is planar or substantially coplanar with the surface of channel semiconductor 102 of active fin 214 upon which the gate stack 106 is formed. In this way, a nonplanar field effect transistor having a reduced gate induced drain leakage (GIDL) may be realized.

FIG. 2B is angled view illustration of a nonplanar device 240 having a thinned active fin portion 242. That is, in an embodiment, the channel semiconductor layer 102 of active fin portion 214 of device 200, in FIG. 2A, is slightly etched or recessed on opposite sides of gate stack 106 to form thinned channel semiconductor layer 102 on opposite sides of gate stack 106. The etching or recessing of active fin 214 may create and undercut beneath spacer 112 to create recesses similar to recesses 154 described in association with FIG. 1B, which extend beneath sidewall spacers 112. The recesses may extend under the spacers on the top of the fin as well along the sidewalls of the fin. As such, when spacer semiconductor layer 114 is deposited it is formed in the cavities on channel semiconductor layer 102 and beneath spacer 112. Contact semiconductor layer 116 may then be formed on spacer semiconductor layer 114 and embodiments may be formed in cavities beneath spacers 112. In an embodiment, the mid-point width of the active fin 214 of FIG. 2A is reduced in width by a factor of 30-50 percent to achieved thinned active fin 242 of FIG. 2B. It is to be appreciated that a cross-sectional view of device 240 taken through the center of the fin from one source/drain region through the channel to the second source/drain region would yield a cross-sectional view similar to what is illustrated in FIG. 1B.

FIG. 2C illustrates yet another nonplanar device 260 having a reduced gate induced drain leakage (GIDL). Device 260 is similar to device 200 except that the entire active fin portion 214 of fin 210 has been removed from opposite sides of the gate electrode as shown in FIG. 2C. In an embodiment, the active fin portion 214 is completely etched away and a recesses are created beneath the sidewall spacers 112. Additionally, in an embodiment, top portion of subfin 212 is also removed creating a slight cavity within isolation layer 220. It is to be appreciated that after removal of the active fin portion 214 from the source/drain regions 108, the active fin portion 214 of fin 210 still remains beneath gate stack 106 creating the channel region 110 of the device. Spacer semiconductor layer 114 is then deposited on subfin 212 and beneath spacer 112. In an embodiment, spacer semiconductor layer 114 extends above isolation layer 220 as illustrated in FIG. 2C. Contact semiconductor layer 116 is then disposed on spacer semiconductor layer 114. It is to be appreciated that spacer semiconductor layer 114 separates contact semiconductor layer 116 from channel semiconductor layer 102 and channel 110. It is to be appreciated that a cross-sectional view of device 260 taken through the center of the fin from one source/drain region through the channel to the second source/drain region would yield a cross-sectional view similar to what is illustrated in FIG. 1B.

Figure 3:
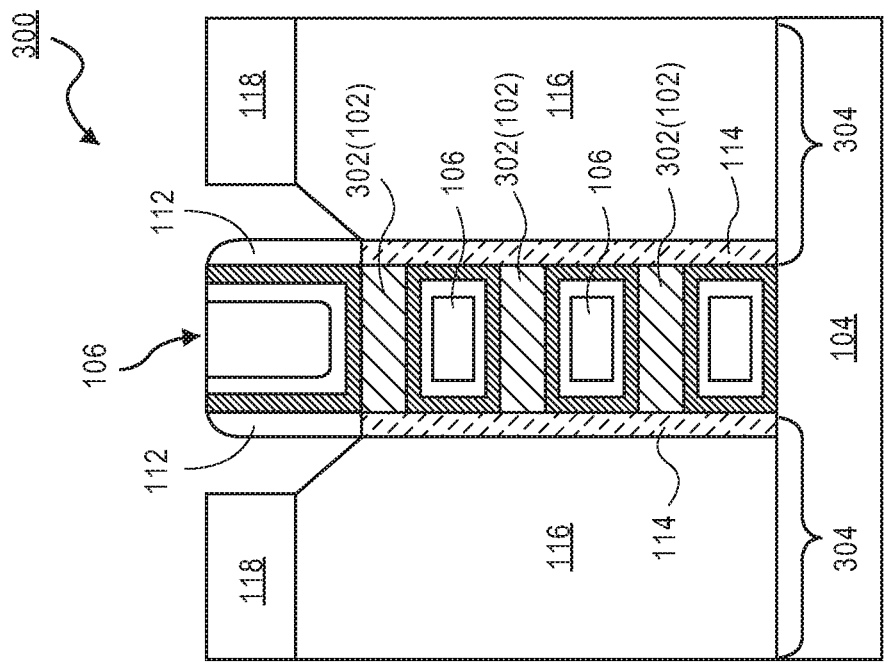
FIG. 3 is an illustration of a cross-sectional view of a nanowire-based semiconductor device having a low band gap channel and source/drain regions with a wide band gap semiconductor to reduce gate induced drain leakage, in accordance with an embodiment of the present invention.

FIG. 3 is an illustration of a cross-sectional view of a nanowire-based semiconductor device 300 having a low band gap channel and source/drain regions with a wide band gap semiconductor to reduce gate induced drain leakage, in accordance with an embodiment of the present invention. Nanowire device 300 includes at least one nanowire 302 and typically a plurality of nanowires 302. Each nanowire is formed from a low band gap channel semiconductor layer 102 as described above. Gate stack 106 completely wraps around and surrounds each nanowire 302. Sidewalls spacers 112 are formed along opposite sidewalls of gate stack 106 as illustrated in FIG. 3.

Like the devices described above, the source/drain regions 304 are formed on opposite sides of the gate stack 106 and adjacent to nanowires 302 and include a spacer semiconductor layer 114 and a contact semiconductor layer 116 as described above. Spacer semiconductor layer 114 is formed directly adjacent and in direct contact with each nanowire 302. Spacer semiconductor layer 114 is in direct contact with contact semiconductor layer 116 as shown in FIG. 3.

In an embodiment, spacer semiconductor layer 114 is a continuous film that is formed directly adjacent to each nanowire as well gate stack 106 as shown in FIG. 3. In other embodiments, an internal spacer may be formed between nanowires and adjacent to the gate stack 106 to separate and further isolate the gate stack 106 from the source/drain region 304. Contacts 118 may be formed on contact semiconductor layer 116 as illustrated in FIG. 3. Additionally, in an embodiment, an additional isolation layer may be formed between the bottom most portion of gate stack 106 and substrate 104 in order to further isolation the gate stack 106 from substrate 104.

In embodiments of the invention may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present invention.

In an embodiment, gate stack 106 is formed of at least two layers, a gate electrode layer 140 and a gate dielectric layer 142. The gate dielectric layer 142 may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer 140 is formed on the gate dielectric layer 142 and may include at least one P-type workfunction metal or N-type workfunction metal, depending on whether the transistor is to be a P-type or an N-type transistor. In some implementations, the gate electrode layer may consist of a stack of two or more metal layers, where one or more metal layers are workfunction metal layers 144 and at least one metal layer is a fill metal layer 146.

For a P-type transistor, metals that may be used for the gate electrode include, but are not limited to, ruthenium, palladium, platinum, cobalt, nickel, and conductive metal oxides, e.g., ruthenium oxide. A P-type metal layer will enable the formation of a P-type gate electrode with a workfunction that is between about 4.9 eV and about 5.2 eV. For an N-type transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an N-type gate electrode with a workfunction that is between about 3.9 eV and about 4.2 eV.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the invention, the gate electrode may consist of a combination of U-shaped structures and planar, non-U-shaped structures. For example, the gate electrode may consist of one or more U-shaped metal layers formed atop one or more planar, non-U-shaped layers.

Sidewall spacers 112 may be formed from a material such as silicon nitride, silicon oxide, silicon carbide, silicon nitride doped with carbon, and silicon oxynitride. Processes for forming sidewall spacers are well known in the art and generally include deposition and etching process operations. In an alternate implementation, a plurality of spacer pairs may be used, for instance, two pairs, three pairs, or four pairs of sidewall spacers may be formed on opposing sides of the gate stack.

One or more interlayer dielectrics (ILD) are deposited over the field effect transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant. Metal layers formed in the ILD may be used to electrically interconnect various transistors 100 formed on substrate 104 into functional integrated circuits, such as but not limited to, microprocessors and memories.

FIGS. 4A-4F is an illustration of cross-sectional views representing various operations in a method of fabricating a semiconductor device having a low band gap channel and recessed source/drain regions with a wide band gap semiconductor to reduce gate induced drain leakage, in accordance with an embodiment of the present invention.

Fabrication of semiconductor devices in accordance with embodiments of the present invention may begin with forming a low band gap channel semiconductor 402 above a substrate 400. As set forth above, channel semiconductor layer 402 may be a low band gap semiconductor, such as germanium or high germanium content SiGe. Substrate 400 may be any well known substrate, such as described above. In a specific embodiment, substrate 400 is monocrystalline silicon substrate. In an embodiment of the present invention, an intermediate layer 401 may be formed between channel semiconductor layer 402 and substrate 400 in order to provide, for example, buffer layers and/or grading layers between substrate 400 and channel semiconductor layer 402 in order to provide a defect free transition in cases where there is a difference in lattice constant between semiconductor channel layer 402 and substrate 400. In an embodiment of the present invention, channel semiconductor layer 402 is a single crystalline semiconductor film formed by any well known techniques, such as but not limited to metal organic chemical vapor deposition (MOCVD) or molecular beam epitaxy (MBE). In a specific embodiment of the present invention, a germanium channel semiconductor layer 402 is formed on a buffer layer comprising a group III-V semiconductor, such as but not limited to GaAs, AlAs and GaInP, which in turn is formed on a monocrystalline silicon substrate. Additionally, in an embodiment of the present invention, at least channel semiconductor layer 402 and possibly portions of immediate layer 401 (if used) or substrate 400 may take the form of a fin or semiconductor body in order to create nonplanar transistors such as illustrated in FIGS. 2A-2C.

Figure 4A:
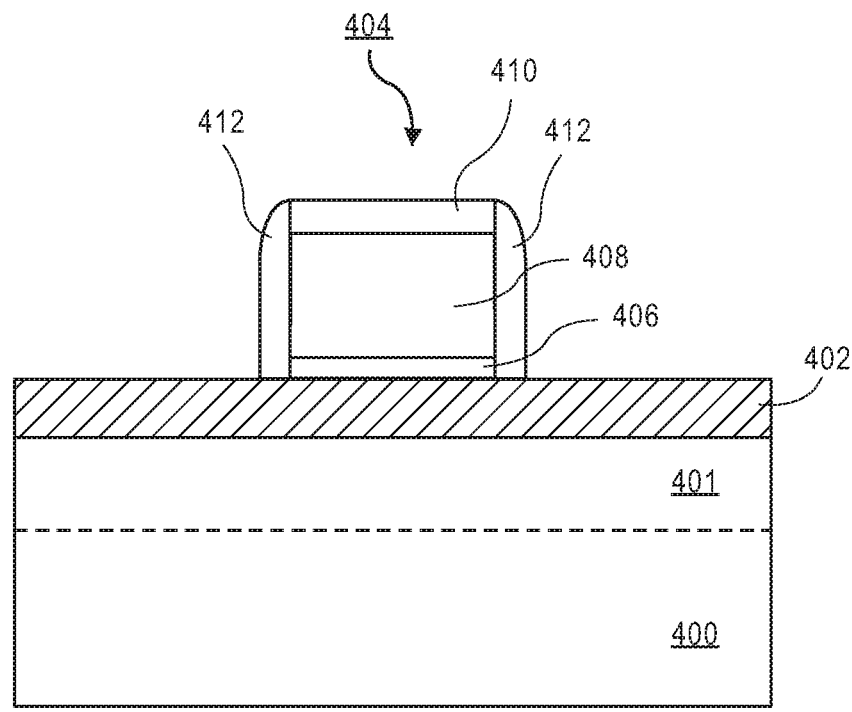
FIGS. 4A-4F is an illustration of cross-sectional views representing various operations in a method of fabricating a semiconductor device having a low band gap channel and recessed source/drain regions with a wide band gap semiconductor to reduce gate induced drain leakage, in accordance with an embodiment of the present invention.

A sacrificial gate stack 404 may be formed on channel semiconductor layer 402 as illustrated in FIG. 4A. In an embodiment, sacrificial gate stack 404 may include a sacrificial gate dielectric layer 406 such as a silicon oxide layer, a sacrificial gate electrode 408, such as polycrystalline silicon or silicon germanium sacrificial gate electrode, and a hard mask 410, such as silicon nitride hard mask as illustrated in FIG. 4A. A pair of sidewall spacer 412 may be formed along laterally opposite sidewalls of sacrificial gate stack 404.

Figure 4B:
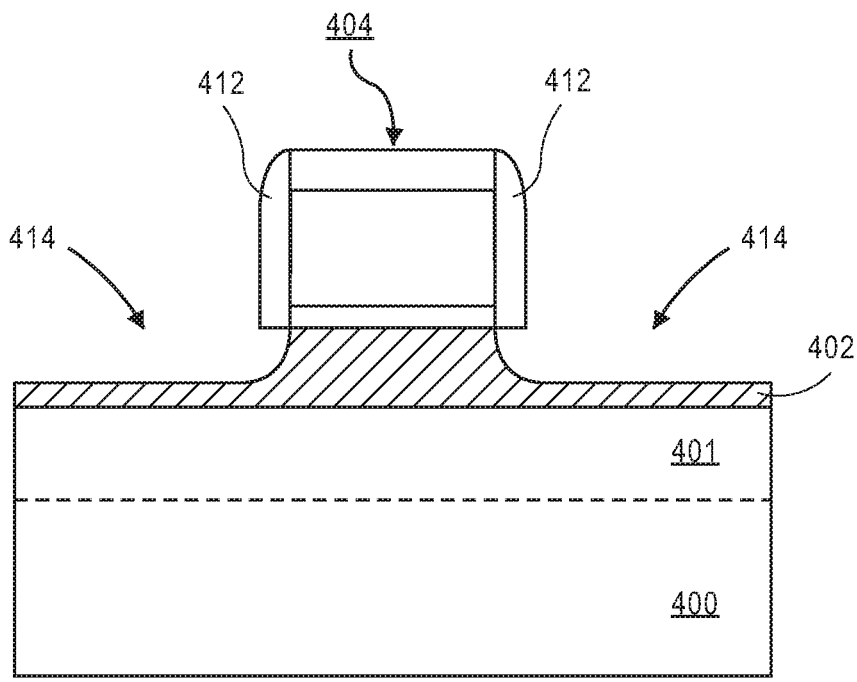

Next, as illustrated in FIG. 4B, a pair of recesses 414 may be formed in channel semiconductor layer 402 on opposite sides of sacrificial gate stack 404 if a semiconductor device having recessed source/drain regions is desired. In an embodiment, recesses 414 extend beneath spacers 412 but not beneath gate stack 404 as illustrated in FIG. 4B. In an embodiment, recesses 414 are formed to depth of between 50-90% of the thickness of channel semiconductor layer 402. Any well known technique, such as etching, may be utilized to form recesses 414. In an embodiment, recesses 414 may be formed by a combination of a plasma etch and a wet etch. In an embodiment, recesses 414 may be faceted (not shown). It is to be appreciated that if a semiconductor device without recessed source/drain regions is desired, then the process illustrated and described with respect to FIG. 4B may be omitted and the source/drain regions are formed on non-recessed channel semiconductor layer 402 as described in association with FIG. 1A.

Figure 4C:
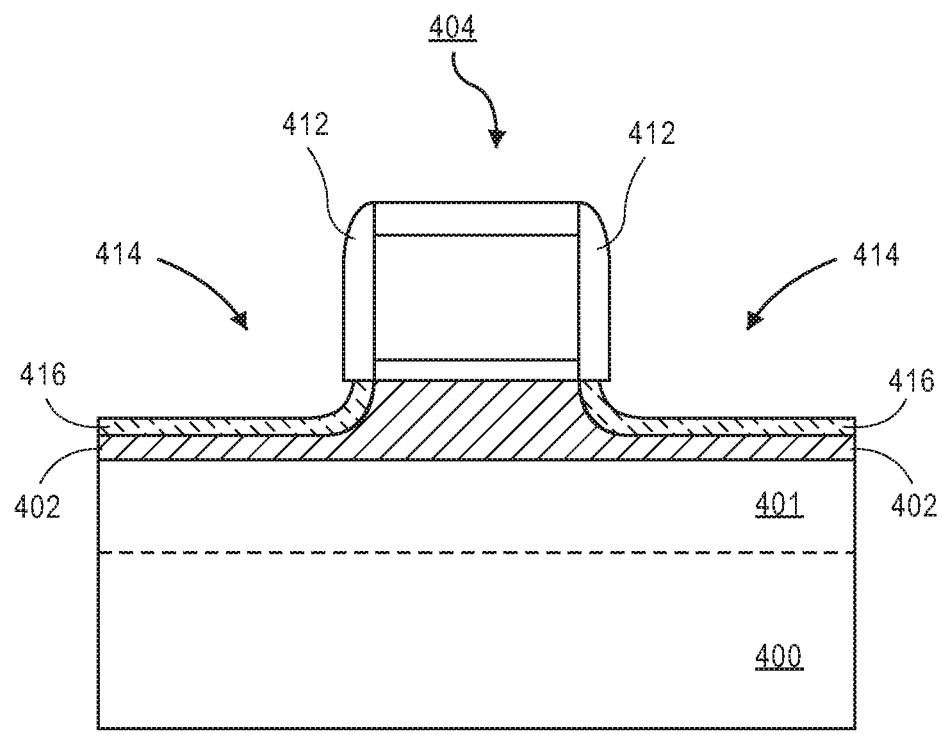

Next, as illustrated in FIG. 4C, a wide band gap spacer semiconductor layer 416, as described above, may be formed on channel semiconductor layer 402 in recesses 416 on opposite sides of sacrificial gate stack 404. In embodiments of the present invention, the spacer semiconductor layer 416 is formed by a selective epitaxial deposition process, such as MOCVD, in order to form a single crystalline semiconductor on channel semiconductor layer 402 but not on sacrificial gate stack 404 or spacers 412. In an embodiment, spacer semiconductor layer 416 is deposited to a thickness which does not completely fill recesses 414 as illustrated in FIG. 4C. In an embodiment of the present invention, spacer semiconductor layer 416 is gallium arsenide (GaAs). A gallium arsenide spacer layer 416 is desirable when utilizing a germanium channel semiconductor layer 402 because GaAs is lattice matched with germanium and, as such, can be formed on a germanium layer in a defect free manner creating a clean interface and pristine film.

In an embodiment of the present invention, spacer semiconductor layer 416 is a silicon germanium semiconductor having a high silicon content (e.g., greater than 50 atomic percent silicon). In an embodiment of the present invention, spacer semiconductor layer 416 is a graded silicon germanium film having a graded concentration profile, such as illustrated in FIG. 5A. For example, a graded silicon germanium spacer layer 416 may be formed by beginning the deposition of the silicon germanium layer with a high concentration of germanium (e.g., approximately 99 atomic percent germanium) and then as the deposition continues, rapidly decreasing the germanium concentration, such as illustrated, for example, in FIG. 5A to a minimum concentration of germanium (e.g., 30 atomic percent germanium). It is to be appreciated that the germanium concentration and distances shown in FIG. 5A is only an exemplary embodiment. Other concentrations and grading rates may be implemented within the spirit and scope of embodiments of the present invention. Once the minimum concentration is reached, the germanium concentration may be increased but more gradually than the decrease of germanium in the beginning of the deposition process. The germanium concentration may be gradually increased until it reaches the desired maximum (e.g., approximately 99 atomic percent germanium). In an embodiment of the present invention, a graded SiGe spacer semiconductor layer 416 may be formed by controlling the relative flow rates of a germanium precursor, such as germane ($GeH_4$) and silicon precursor, such as silane ($SiH_4$).

It is to be appreciated that according to the description above, symmetric devices are fabricated in that the wide band gap spacer semiconductor layer 416 is formed on both the source side and the drain side of the device. For example, FIGS. 1A, 1B, 2A-2C and 3 all show examples of symmetric devices. However, in other embodiments, wide band gap spacer semiconductor layer 416 may be only formed on a drain side of the semiconductor device to form an asymmetric semiconductor device. Such an asymmetric device may be fabricated by masking the source side, e.g., with an oxide blocking layer, during the fabrication of the wide band gap spacer semiconductor layer 416 on an exposed drain side of the semiconductor device.

Figure 4D:
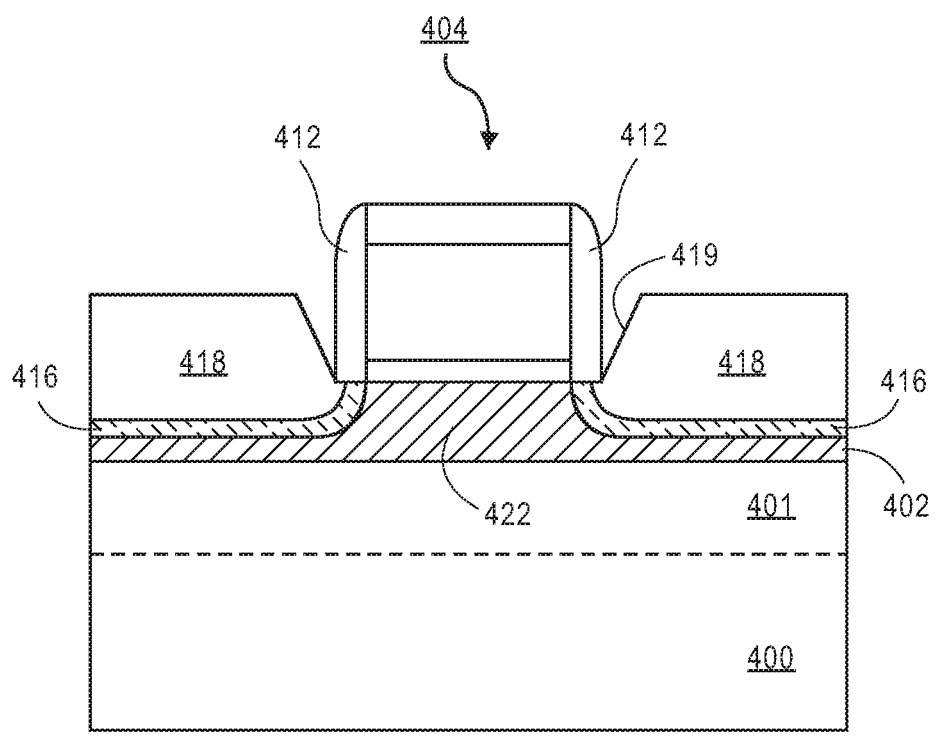

Next, as illustrated in FIG. 4D, a contact semiconductor layer 418, such as described above, may be formed on spacer semiconductor layer 416 on opposite sides of gate stack 404. In a specific embodiment of the present invention, contact semiconductor layer 418 is germanium. In an embodiment, contact semiconductor layer 418 is formed in recesses 414 and beneath spacers 412 as illustrated in FIG. 4D. In an embodiment, contact semiconductor is deposited to a thickness sufficient to completely fill recesses 416 and in further embodiments, to a thickness so that the top surface of contact semiconductor 418 extends above the surface of channel semiconductor layer 402 upon which sacrificial gate stack 404 is formed in order to create raised source/drain regions to reduce the contact resistance (R external).

In an embodiment of the present invention, contact semiconductor layer 418 is selectively epitaxially grown by, for example, MOCVD so that it forms only on spacer semiconductor layer 416 but not on gate stack 404 or spacers 412. In an embodiment, contact semiconductor layer 418 is epitaxially grown such that facets 419 are formed resulting in contact semiconductor material 418 tapering away from gate stack 404 and spacers 412 as it is deposited. In an embodiment of the present invention, contact semiconductor layer 418 is in situ doped while it is deposited. In an embodiment of the present invention, contact semiconductor layer 418 is in situ doped with boron atoms to a concentration of approximately $1 \times 10^{20}$ atoms/cm$^3$ while it is deposited. In an embodiment, an ion implantation process may be used in conjunction with or instead of in situ doping in order to highly dope the contact semiconductor layer 418, the wide band gap spacer semiconductor layer 416 and any portions of the channel semiconductor layer 402 in the source/drain regions.

Figure 4E:
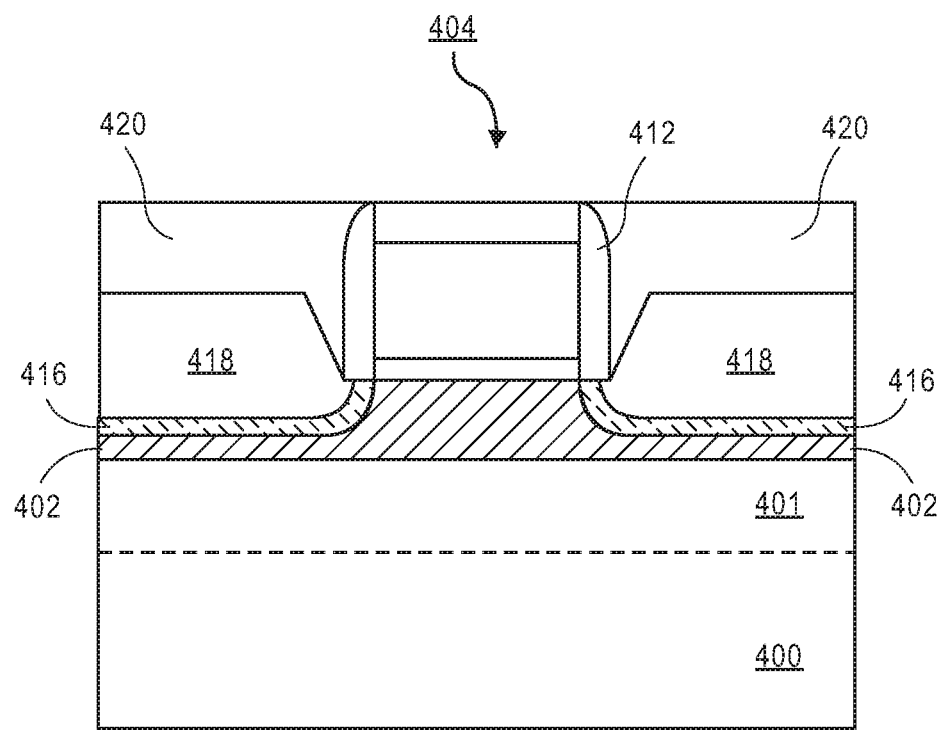

Next, as illustrated in FIG. 4E, an insulating layer 420 may be formed over contact semiconductor layer 418 and directly adjacent to spacers 412 along sacrificial gate stack 404. In an embodiment of the present invention, an insulating layer, such as a silicon oxide layer, a carbon doped oxide layer, or a silicon nitride layer is blanket deposited over contact semiconductor 418 as well as spacers 412 and sacrificial gate stack 404. The insulating layer 420 may then planarized by, for example, chemical mechanical polishing to create a top surface which is substantially coplanar with the top of sacrificial gate stack 404 as shown in FIG. 4E. Insulating layer 420 may comprise a first interlayer dielectric (e.g., ILD0) of a back end interconnect structure utilized to interconnect together various semiconductor devices formed on substrate 400 into functional circuits.

Next, sacrificial gate stack 404 may be removed and replaced with a gate stack 430. In an embodiment of the present invention, sacrificial gate stack 404 is removed by etching. In an embodiment, sacrificial gate dielectric 406 provides an etch stop layer for the etching process used to remove sacrificial gate electrode 408. By using the sacrificial gate dielectric 406 as an etch stop layer, the pristine nature of the underlying channel region may be protected from a harsh etching process used to remove the sacrificial gate electrode 408. A second etch process may then be performed to remove sacrificial gate dielectric 406.

Figure 4F:
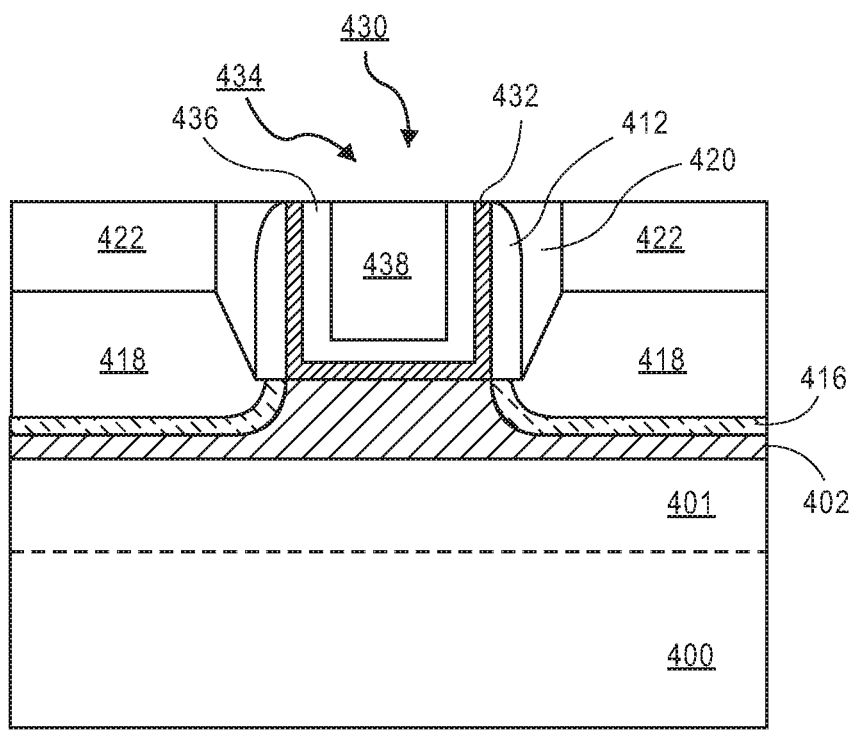

Once sacrificial gate stack 404 has been removed, a permanent gate stack 430 for the semiconductor device of the present invention, is formed. In an embodiment, gate stack 430 includes a gate dielectric layer 432 and a gate electrode 434. In an embodiment, gate dielectric layer 432 is formed directly on the channel region 422 of channel semiconductor 402. In an embodiment of the present invention, gate dielectric 432 is a high k dielectric layer formed by, for example, atomic layer deposition (ALD). In an embodiment of the present invention, the high k gate dielectric layer 432 is formed on the channel region 422 of channel semiconductor layer 402 as well as along the sidewalls of spacers 412 resulting in a U-shaped gate dielectric layer as illustrated in FIG. 4F. In embodiments, a thin interfacial oxide layer may be formed between high k gate dielectric layer 432 and channel semiconductor layer 402. Additionally, in an embodiment of the present invention, gate electrode 434 may include a work function metal 436 and a fill metal 438. In an embodiment, work function metal 436 is conformally or substantially conformally formed on gate dielectric layer 432 resulting in a U-shape work function metal 436. A fill metal 438 may then be formed on the work function metal 436.

Next, contact openings may be etched through insulating layer 420 to expose portions of contact semiconductor 418. A contact metal 422 may then be formed in the opening in contact with contact semiconductor layer 418 as illustrated in FIG. 4F. The contact metal 422 may be utilized as a first level metal to interconnect together various semiconductor devices formed on substrate 400 into functional circuits.

Figure 6:
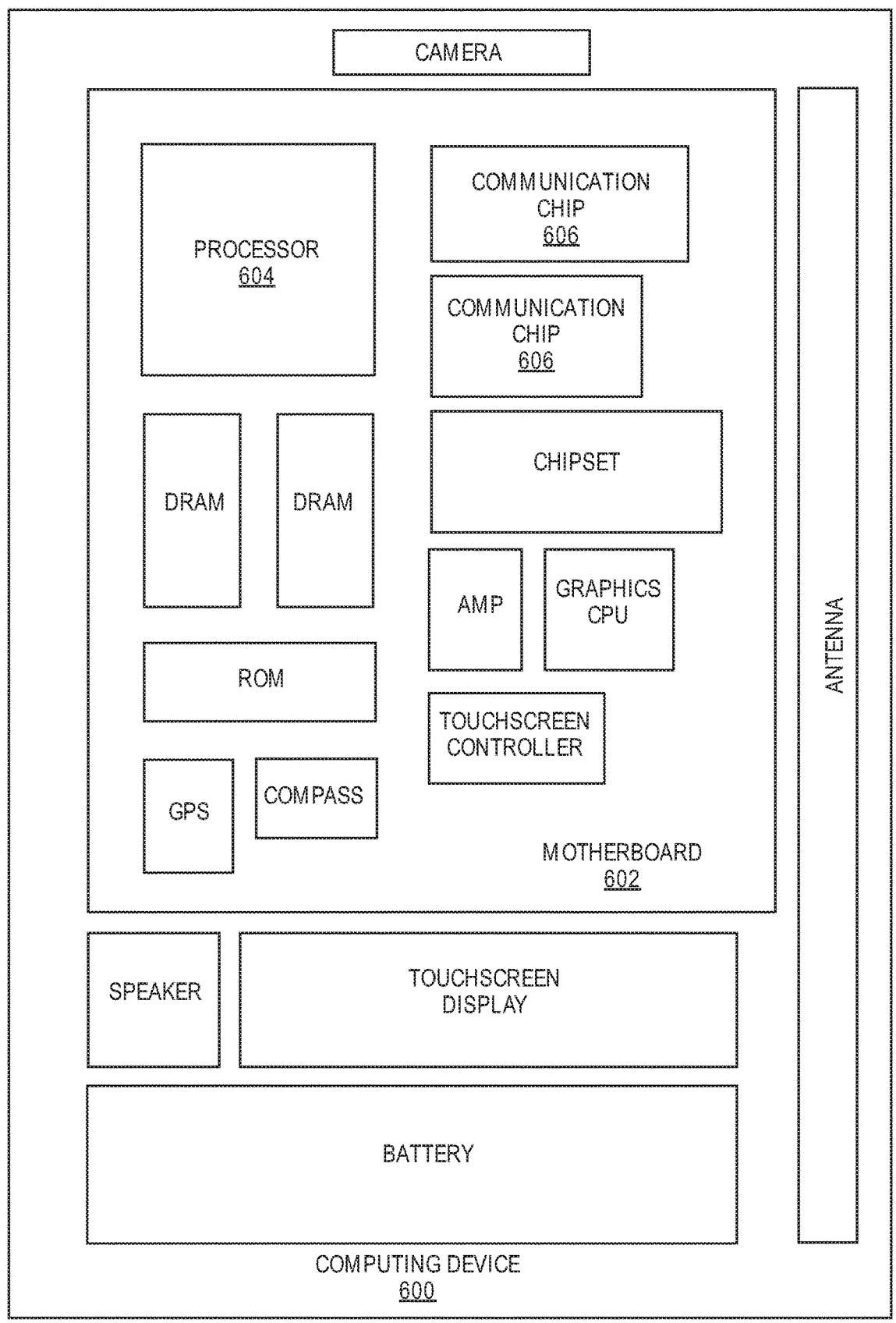
FIG. 6 illustrates a computing device in accordance with one implementation of an embodiment of the invention.

FIG. 6 illustrates a computing device 600 in accordance with one implementation of the invention. The computing device 600 houses a board 602. The board 602 may include a number of components, including but not limited to a processor 604 and at least one communication chip 606. The processor 604 is physically and electrically coupled to the board 602. In some implementations the at least one communication chip 606 is also physically and electrically coupled to the board 602. In further implementations, the communication chip 606 is part of the processor 604.

Depending on its applications, computing device 600 may include other components that may or may not be physically and electrically coupled to the board 602. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 606 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

The processor 604 of the computing device 600 includes an integrated circuit die packaged within the processor 604. In some implementations of the invention, the integrated circuit die of the processor includes one or more devices, such as field effect transistors built in accordance with implementations of the invention. The term "processor" may refer to any device or portion of a device that processes electronic data from registers and/or memory to transform that electronic data into other electronic data that may be stored in registers and/or memory.

The communication chip 606 also includes an integrated circuit die packaged within the communication chip 606. In accordance with another implementation of the invention, the integrated circuit die of the communication chip includes one or more devices, such as FET transistors built in accordance with implementations of the invention.

In further implementations, another component housed within the computing device 300 may contain an integrated circuit die that includes one or more devices, such as FET transistors built in accordance with implementations of the invention.

In various implementations, the computing device 600 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

Figure 7:
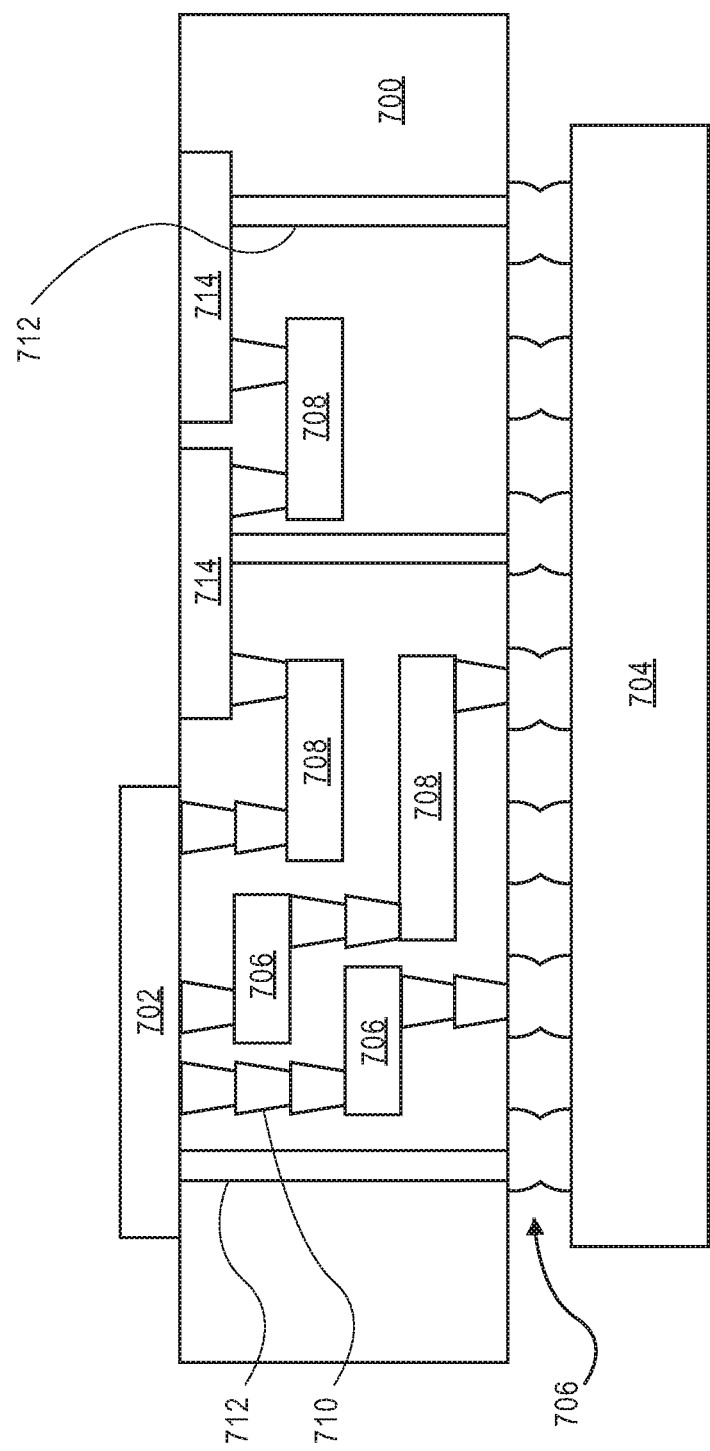
FIG. 7 is an interposer implementing one or more embodiments of the invention.

FIG. 7 illustrates an interposer 700 that includes one or more embodiments of the invention. The interposer 700 is an intervening substrate used to bridge a first substrate 702 to a second substrate 704. The first substrate 702 may be, for instance, an integrated circuit die. The second substrate 704 may be, for instance, a memory module, a computer motherboard, or another integrated circuit die. Generally, the purpose of an interposer 700 is to spread a connection to a wider pitch or to reroute a connection to a different connection. For example, an interposer 700 may couple an integrated circuit die to a ball grid array (BGA) 706 that can subsequently be coupled to the second substrate 704. In some embodiments, the first and second substrates 702/704 are attached to opposing sides of the interposer 700. In other embodiments, the first and second substrates 702/704 are attached to the same side of the interposer 700. And in further embodiments, three or more substrates are interconnected by way of the interposer 700.

The interposer 700 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 708 and vias 710, including but not limited to through-silicon vias (TSVs) 712. The interposer 700 may further include embedded devices 714, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 700. In accordance with embodiments of the invention, apparatuses or processes disclosed herein may be used in the fabrication of interposer 700.

Embodiments of the present invention are directed to low band gap channel semiconductor devices having reduced gate induced drain leakage (GIDL) and their methods of fabrication.

In an embodiment, a device includes a first semiconductor material formed above a substrate, the first semiconductor material having a first band gap. A gate dielectric layer is on a surface of the first semiconductor material. A gate electrode is on the gate dielectric layer. A pair of source/drain regions is on opposite sides of the gate electrode. A channel is disposed in the first semiconductor material between the pair of source/drain regions and beneath the gate electrode. The pair of source/drain regions includes a second semiconductor material having a second band gap, and a third semiconductor material having a third band gap. The second semiconductor material is between the first semiconductor material and the third semiconductor material, and the second band gap is greater than the first bandgap.

In one embodiment, the second bandgap is at least 150 meV greater than the first band gap.

In one embodiment, the second bandgap is between 150 meV-500 meV greater than the first band gap.

In one embodiment, the second bandgap is greater than the third band gap.

In one embodiment, the channel region has a channel length, and the second semiconductor has a thickness between 10-25% of the channel length.

In one embodiment, the first semiconductor material is germanium.

In one embodiment, the second semiconductor material is selected from the group consisting of a group III-V semiconductor and SiGe having a high Si content.

In one embodiment, the second semiconductor is a graded SiGe semiconductor having a high Ge content near the channel and a lower Ge content near the third semiconductor material.

In one embodiment, the second semiconductor material is formed on a surface of the first semiconductor material which is substantially coplanar with the surface on which gate dielectric layer is disposed.

In one embodiment, the device further includes a pair of sidewall spacers formed along opposite sidewalls of the gate electrode, where the second semiconductor material is disposed on a surface of the first semiconductor material beneath the surface on which the gate dielectric layer is formed.

In one embodiment, the second semiconductor material is located beneath the pair of sidewall spacers.

In an embodiment, a method of forming a device includes forming a first semiconductor material above a substrate, the first semiconductor material having a first band gap. A gate dielectric is formed on a surface of the first semiconductor material. A gate electrode is formed on the gate dielectric layer. A second semiconductor material having a second band gap is formed on the first semiconductor material on opposite sides of the gate electrode, the second band gap greater than the first bandgap. A third semiconductor material having a third band gap is formed on the second semiconductor material on opposite sides of the gate electrode.

In one embodiment, the method further includes forming a pair of sidewall spacers along opposite sides of the gate electrode prior to forming the second semiconductor material and the third semiconductor material.

In one embodiment, the method further includes etching a pair of recesses in the first semiconductor material on opposite sides of the gate electrode and the depositing the second semiconductor material and the third semiconductor material in the recesses.

In one embodiment, the recesses extend beneath the pair of sidewall spacers.

In one embodiment, the method further includes forming a sacrificial gate dielectric layer and a sacrificial gate electrode on the first semiconductor material prior to forming the second semiconductor material and the third semiconductor material, and, after forming the second semiconductor material and the third semiconductor material, removing the sacrificial gate electrode and sacrificial gate dielectric layer and then forming the gate dielectric layer and gate electrode.

In an embodiment, a device includes a fin comprising a first semiconductor material having a first band gap, the fin having a top and laterally opposite sidewalls. A gate dielectric layer is on the top and laterally opposite sidewalls of the fin. A gate electrode is on the gate dielectric layer on the top and laterally opposite sidewalls of the fin. A pair of source/drain region is on opposite sides of the gate electrode, the pair of source/drain regions including a second semiconductor material having a second band gap, and a third semiconductor material having a third band gap. The second semiconductor material is between the first semiconductor material and the third semiconductor material, and the second band gap is greater than the first band gap.

In one embodiment, the second band gap is at least 150 meV greater than the first band gap.

In one embodiment, the second band gap is greater than the third band gap.

In one embodiment, the second semiconductor is formed on the top and sidewalls of the fin on opposite sides of the gate electrode and the third semiconductor is formed on the second semiconductor on the top and sidewalls of the fin.

In one embodiment, the device further includes a pair of recesses formed on opposite side of the gate electrode, and the first and second semiconductor materials are formed in the pair of recesses.

In one embodiment, the device further includes a pair of sidewall spacers formed along laterally opposite sides of the gate electrode, where the pair of recesses extends beneath the laterally opposite sidewalls.

In one embodiment, the first semiconductor material is germanium and the second semiconductor material is selected from the group consisting of a III-V semiconductor and SiGe. In one embodiment, the second semiconductor material is SiGe and the SiGe is graded and has a larger Ge concentration near the first semiconductor material and a lower Ge concentration near the third semiconductor material.

We claim:

1. A device comprising:
    a first semiconductor material formed above a substrate, the first semiconductor material having a first band gap;
    a gate dielectric layer on a surface of the first semiconductor material;
    a gate electrode on the gate dielectric layer;
    a pair of source/drain regions on opposite sides of the gate electrode;
    a channel disposed in the first semiconductor material between the pair of source/drain regions and beneath the gate electrode; and
    wherein the pair of source/drain regions comprises a second semiconductor material having a second band gap, and a third semiconductor material having a third band gap, wherein the second semiconductor material is between the first semiconductor material and the third semiconductor material and wherein the second band gap is greater than the first bandgap.

2. The device of claim 1 wherein the second bandgap is at least 150 meV greater than the first band gap.

3. The device of claim 2 wherein the second bandgap is between 150 meV-500 meV greater than the first band gap.

4. The device of claim 1 wherein the second bandgap is greater than the third band gap.

5. The device of claim 1 wherein the channel region has a channel length, and wherein the second semiconductor has a thickness between 10-25% of the channel length.

6. The device of claim 1 wherein the first semiconductor material is germanium.

7. The device of claim 6 wherein the second semiconductor material is selected from the group consisting of a group III-V semiconductor and SiGe having a high Si content.

8. The device of claim 7 wherein the second semiconductor is a graded SiGe semiconductor having a high Ge content near the channel and a lower Ge content near the third semiconductor material.

9. The device of claim 1 wherein the second semiconductor material is formed on a surface of the first semiconductor material which is substantially coplanar with the surface on which gate dielectric layer is disposed.

10. The device of claim 1 further comprising a pair of sidewall spacers formed along opposite sidewalls of the gate electrode, wherein the second semiconductor material is disposed on a surface of the first semiconductor material beneath the surface on which the gate dielectric layer is formed.

11. The device of claim 10 wherein the second semiconductor material is located beneath the pair of sidewall spacers.

12. A device comprising:
    a fin comprising a first semiconductor material having a first band gap, the fin having a top and laterally opposite sidewalls;
    a gate dielectric layer on the top and laterally opposite sidewalls of the fin;
    a gate electrode on the gate dielectric layer on the top and laterally opposite sidewalls of the fin;

a pair of source/drain region on opposite sides of the gate electrode, the pair of source/drain regions comprising a second semiconductor material having a second band gap, and a third semiconductor material having a third band gap, wherein the second semiconductor material is between the first semiconductor material and the third semiconductor material, and wherein the second band gap is greater than the first band gap.

13. The device of claim 12 wherein the second band gap is at least 150 meV greater than the first band gap.

14. The device of claim 12 wherein the second band gap is greater than the third band gap.

15. The device of claim 12 wherein the second semiconductor is formed on the top and sidewalls of the fin on opposite sides of the gate electrode and wherein the third semiconductor is formed on the second semiconductor on the top and sidewalls of the fin.

16. The device of claim 12 further comprising a pair of recesses formed on opposite side of the gate electrode, and wherein the first and second semiconductor materials are formed in the pair of recesses.

17. The device of claim 16 further comprising a pair of sidewall spacers formed along laterally opposite sides of the gate electrode, wherein the pair of recesses extends beneath the laterally opposite sidewalls.

18. The device of claim 12 wherein the first semiconductor material is germanium and the second semiconductor material is selected from the group consisting of a III-V semiconductor and SiGe.

19. The device of claim 18 wherein the second semiconductor material is SiGe and wherein the SiGe is graded and has a larger Ge concentration near the first semiconductor material and a lower Ge concentration near the third semiconductor material.

* * * * *